(12) United States Patent
Aigner et al.

(10) Patent No.: US 6,909,340 B2
(45) Date of Patent: Jun. 21, 2005

(54) BULK ACOUSTIC WAVE FILTER UTILIZING RESONATORS WITH DIFFERENT ASPECT RATIOS

(75) Inventors: Robert Aigner, München (DE); Stephan Marksteiner, Putzbrunn (DE); Winfried Nessler, München (DE); Lüder Elbrecht, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/446,984

(22) Filed: May 27, 2003

(65) Prior Publication Data

US 2003/0227356 A1 Dec. 11, 2003

Related U.S. Application Data

(63) Continuation of application No. PCT/EP01/12825, filed on Nov. 6, 2001.

(30) Foreign Application Priority Data

Nov. 24, 2000 (DE) .......................................... 100 58 339

(51) Int. Cl.[7] .............................. H03H 9/54; H03H 9/56
(52) U.S. Cl. ........................ 333/189; 333/191; 310/312; 310/322; 310/363
(58) Field of Search .............................. 333/186–192; 310/312, 322, 348, 363–366

(56) References Cited

U.S. PATENT DOCUMENTS

| | | | |
|---|---|---|---|
| 3,582,836 A | * 6/1971 | Kent | ............................ 333/191 |
| 4,317,093 A | 2/1982 | Lungo | ......................... 333/187 |
| 4,398,162 A | 8/1983 | Nagai | .......................... 333/189 |
| 4,975,616 A | 12/1990 | Park | ............................ 310/339 |
| 5,570,070 A | * 10/1996 | Ogawa et al. | .............. 333/187 |
| 5,572,173 A | 11/1996 | Ogawa et al. | .............. 333/187 |
| 5,903,087 A | 5/1999 | Mattson et al. | .............. 310/365 |
| 5,942,958 A | * 8/1999 | Lakin | .......................... 333/189 |
| 6,081,171 A | 6/2000 | Ella | ............................. 333/189 |
| 6,307,447 B1 | * 10/2001 | Barber et al. | ................ 333/189 |
| 6,377,136 B1 | * 4/2002 | Rittenhouse et al. | ........ 333/188 |
| 6,377,137 B1 | * 4/2002 | Ruby | .......................... 333/189 |

FOREIGN PATENT DOCUMENTS

| | | |
|---|---|---|
| DE | 31 40 719 C2 | 6/1982 |
| DE | 39 27 306 A1 | 2/1990 |
| EP | 1 017 170 A2 | 7/2000 |
| EP | 1 041 717 A2 | 10/2000 |
| JP | 63-253711 | * 10/1988 ................. 333/187 |

OTHER PUBLICATIONS

Lakin, K. M. et al.: "High–Q Microwave Acoustic Resonators and Filters", IEEE Transactions on Microwave Theory and Techniques, vol. 41, No. 12, 1993, pp. 2139–2146.

* cited by examiner

Primary Examiner—Barbara Summons
(74) Attorney, Agent, or Firm—Laurence A. Greenberg; Werner H. Stemer; Ralph E. Locher

(57) ABSTRACT

The invention relates to bulk acoustic wave filters including at least two bulk acoustic wave resonators. Each of these resonators includes at least one first electrode, a piezoelectric layer, and a second electrode. At least two of the bulk acoustic wave resonators have effective resonator surfaces which differ in their surface form and/or surface content. The inventive design of the bulk acoustic wave resonators enables optimal suppression of interference modes without influencing the impedance level of the filter.

12 Claims, 10 Drawing Sheets

2-stage ladder filter

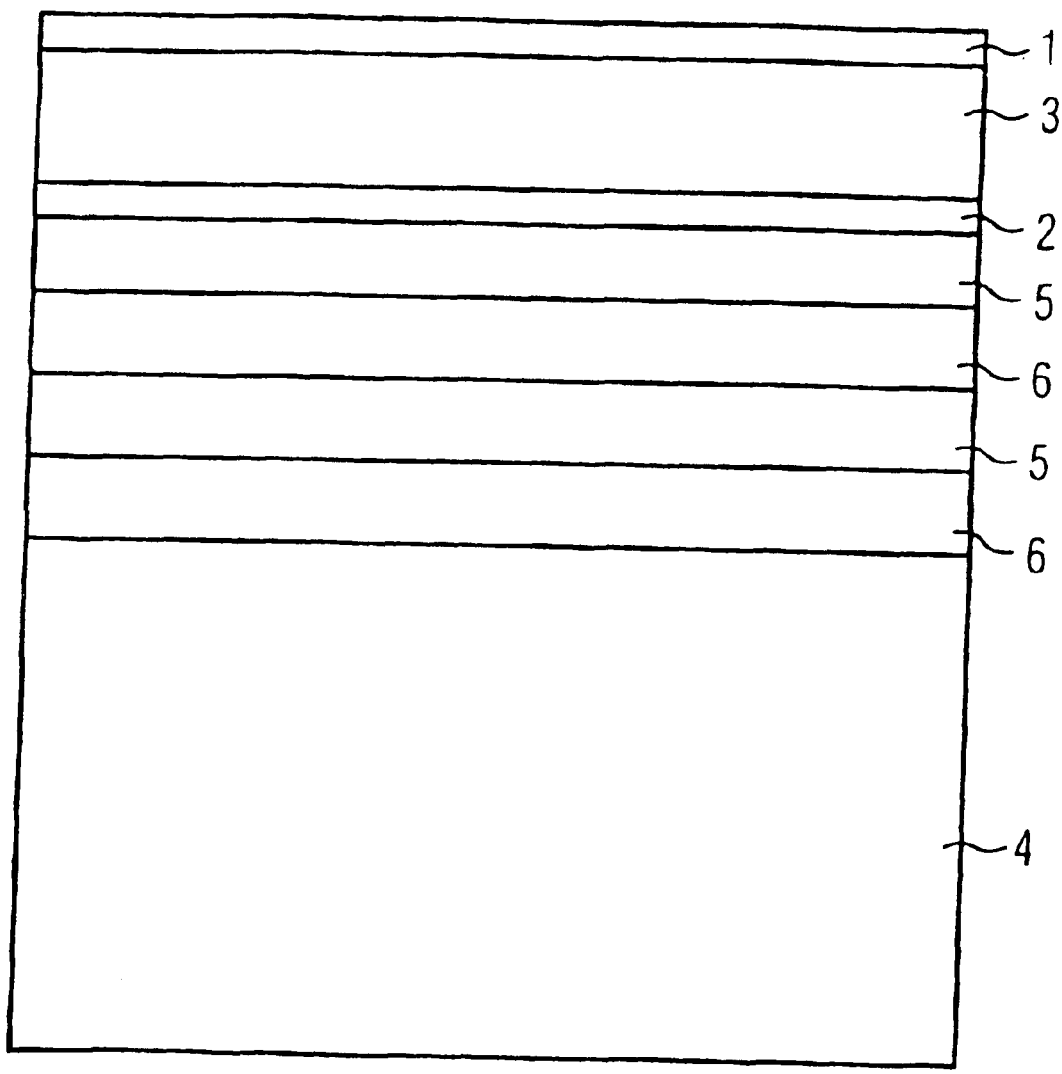

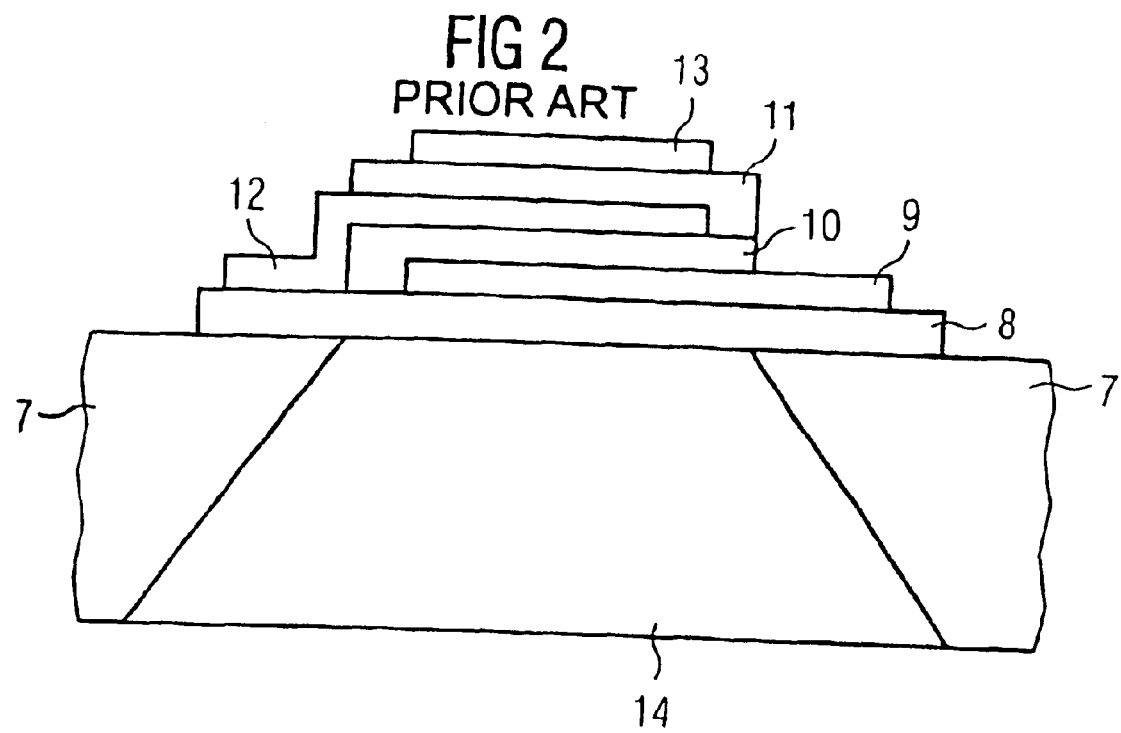
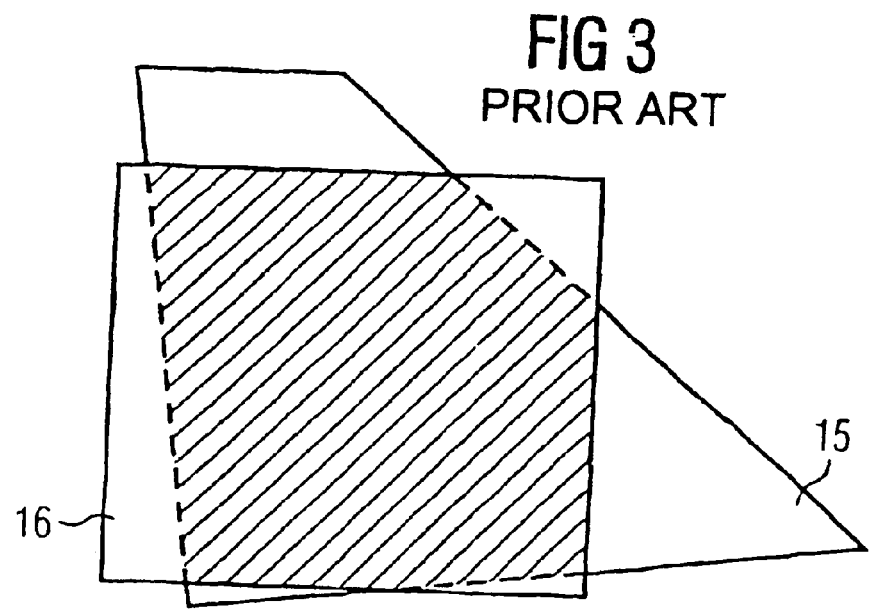

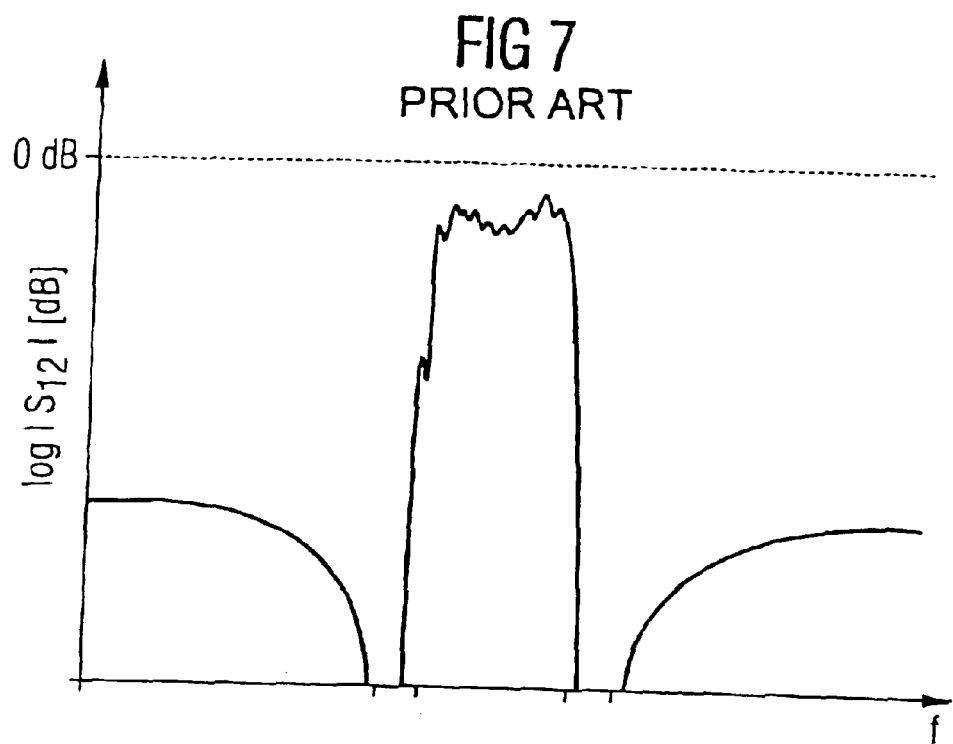
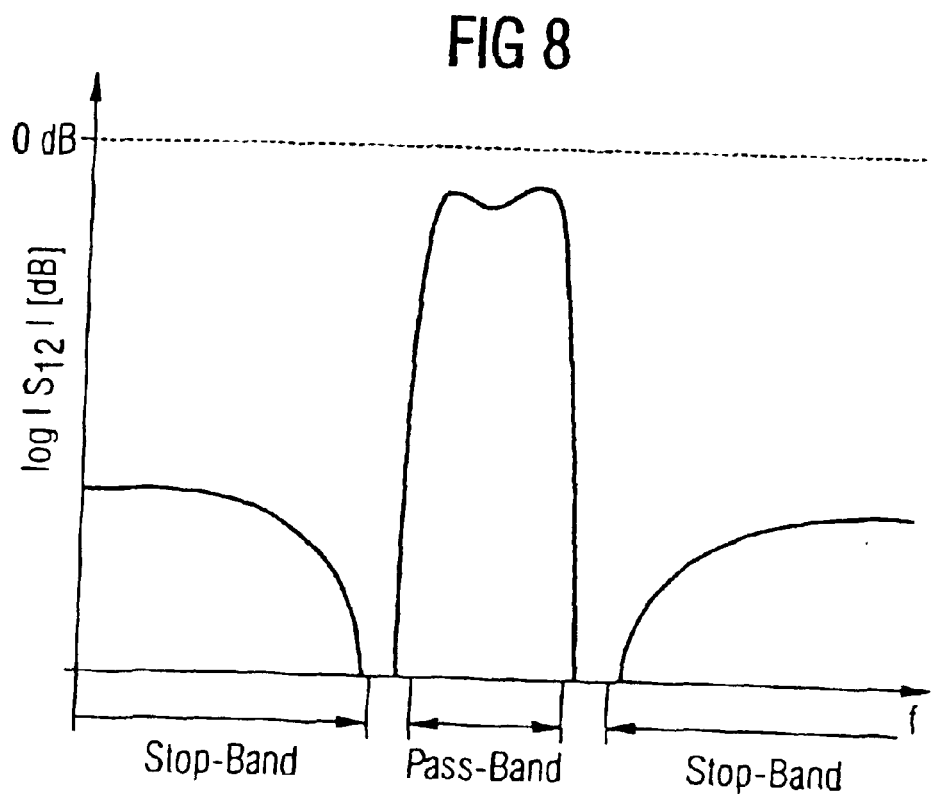

BULK ACOUSTIC WAVE FILTER UTILIZING RESONATORS WITH DIFFERENT ASPECT RATIOS

CROSS-REFERENCE TO RELATED APPLICATION

This application is a continuation of copending International Application No. PCT/EP01/12825, filed Nov. 6, 2001, which designated the United States and was not published in English.

BACKGROUND OF THE INVENTION

Field of the Invention

The invention relates to bulk acoustic wave filters.

Electrical filters which are formed from bulk acoustic wave resonators or stacked crystal filters are normally referred to as bulk acoustic wave filters.

Bulk acoustic wave resonators typically include two electrodes and a piezo-electric layer, which is arranged between the two electrodes. A stack such as this, which is formed from an electrode/piezo-electric layer/electrode, is arranged on a mount that reflects the acoustic wave (M. Kenneth, G. R. Kline, K. T. McCarron, High-Q Microwave Acoustic Resonators and Filters, IEEE Transactions on Microwave Theory and Techniques, Vol. 41, No. 12, 1993).

FIG. 1 shows a cross section through a bulk acoustic wave resonator. In principle, it would be desirable to use a configuration including only an electrode 1/piezo-electric layer 3/electrode 2. However, an arrangement such as this is not sufficiently robust. The arrangement is therefore applied to a substrate 4, although this is associated with the disadvantage that the sound waves penetrate into the substrate 4, in consequence resulting in interference. The substrate 4 should at the same time provide as good acoustic isolation as possible in addition to providing a mechanical supporting function. FIG. 1 shows an acoustic mirror, which includes a substrate 4 and a sequence of two low-Z 5 layers and two high-Z 6 layers.

Stacked crystal filters in general include two piezoelectric layers and three electrodes. This total of five elements forms a sandwich structure, with one piezo-electric layer in each case being arranged between two electrodes. The central one of the three electrodes is in this case generally used as a grounding electrode.

FIG. 2 shows a cross section through a stacked crystal filter. The stacked crystal filter includes a substrate 7, a membrane 8, a first, lower electrode 9, a first, lower piezo-electric layer 10, a second, upper piezo-electric layer 11, a second, central electrode 12 and a third, upper electrode 13. The central electrode 12 is arranged above a part of the lower piezo-electric layer 10 and of the membrane 8, the upper piezo-electric layer 11 is arranged above parts of the central electrode 12 and of the lower piezo-electric layer 10, and the third, upper electrode 13 is arranged above the upper piezo-electric layer 11. The second electrode 12 is used as a grounding electrode. The substrate 7 has a cavity 14 which is used to reflect the acoustic oscillations of the piezo-electric layers.

The reflection of the acoustic oscillations is thus achieved either using an acoustic mirror or using a cavity. An acoustic mirror has been described above in conjunction with a bulk acoustic wave resonator, while the reflection of the acoustic oscillations has been shown using a cavity for a stacked crystal filter. However, the opposite combination is, of course, also possible, that is to say a bulk acoustic wave resonator in combination with a cavity in the substrate, and a stacked crystal filter in combination with an acoustic mirror.

The piezo-electric layers are generally formed from aluminum nitride. Aluminum, alloys containing aluminum, tungsten, molybdenum and platinum are frequently used as the material for the electrodes. Silicon, gallium arsenide, glass or a sheet, for example, can be used as the substrate material.

As has already been explained above, each bulk acoustic wave resonator or stacked crystal filter has at least two electrodes. FIG. 3 shows a view of two electrodes mounted one on top of the other, namely a lower electrode 15 and an upper electrode 16. The two electrodes may have any desired geometric shape. For the purposes of the present invention, the "effective resonator surface" is regarded as the surface of the electrodes which results from the overlapping area of the electrodes when the two electrodes are projected in a plane. The effective resonator surface of the electrodes 15 and 16 is illustrated in shaded form in FIG. 3. Since the electrodes 15 and 16 may in principle have any desired shape, this means that the effective resonator surface may be a planar surface of any desired shape.

Every bulk acoustic wave resonator therefore has a specific effective resonator surface, which is characterized by its geometric shape and by its surface content. Two bulk acoustic wave resonators with different effective resonator surfaces may thus differ in principle in the surface shape of the effective resonator surface and/or in the surface content of the effective resonator surface.

A bulk acoustic wave filter is composed of two or more bulk acoustic wave resonators or stacked crystal filters connected in parallel or in series. The expression "bulk acoustic wave resonator" is used synonymously for both devices in the following text, and FIGS. 1 and 2 show apparatuses used for them, namely bulk acoustic wave resonators and stacked crystal filters.

Bulk acoustic wave filters are generally designed such that the series-connected resonators have a series resonance whose frequency corresponds as precisely as possible to the desired frequency of the filter while, in a corresponding way, the parallel-connected resonators have a parallel resonance, whose frequency likewise corresponds as precisely as possible to the desired frequency of the filter.

One particular problem with the use of bulk acoustic wave filters is the spurious modes of the bulk acoustic wave resonators from which the filters are formed. These spurious modes lead to interference spikes in the electrical impedance curve of the bulk acoustic wave resonators, which then also have a disadvantageous effect on the pass band of the filters. In particular, the standing wave ratio is made worse and/or the phase curve of the filters is distorted, which, for example, infringes the condition of a constant group delay time within a transmission channel in receiver front ends.

Various approaches to the suppression of the spurious modes are known from the prior art. U.S. Pat. No. 5,903,087 discloses bulk acoustic wave resonators whose electrodes are not smoothed at the edges, but in fact, have roughened edges in the form of a random pattern, with the roughness being approximately of the same magnitude as the wavelengths of the spurious modes. The spurious modes are thus suppressed, and are less visible in the impedance curve. However, this method results in a major energy losses, which affect the Q-factor of the main resonances.

SUMMARY OF THE INVENTION

It is accordingly an object of the invention to provide a bulk acoustic wave filter, which overcomes the above-mentioned disadvantages of the prior art apparatus of this general type.

In particular, it is an object of the invention to provide bulk acoustic wave filters in which the spurious modes are attenuated, but in which at the same time, the useful resonance is influenced only insignificantly, or not at all.

With the foregoing and other objects in view there is provided, in accordance with the invention, a bulk acoustic wave filter including a plurality of bulk acoustic wave resonators. The plurality of bulk acoustic wave resonators can be two or more resonators. Each of the plurality of bulk acoustic wave resonators has at least one first electrode, one piezo-electric layer and one second electrode. The plurality of bulk acoustic wave resonators have effective resonator surfaces with different surface shapes and/or different surface contents.

Since at least two of the bulk acoustic wave resonators have effective resonator surfaces that differ in the surface shape and/or surface content, this configuration of the bulk acoustic wave resonators allows spurious modes to be suppressed optimally, without influencing the impedance level of the filter in the process.

Since each resonator has different spurious mode frequencies, an averaging effect occurs by virtue of the connections in the filter. In consequence, the individual spurious mode in the filter response is not so strongly noticeable in comparison to the bulk acoustic wave filters which are known from the prior art, with resonators with the same surface area. However, different surface contents of the effective resonator surfaces also influence the impedance level of the resonators. They are thus governed to a certain extent by impedance matching conditions in the filter.

All of the embodiments of the present invention are thus based on the fact that no attempt is made to make the individual bulk acoustic wave resonator free of spurious modes, which is technically difficult and possibly results in a loss of resonator performance, but rather are based on washing out a large number of spurious modes at different frequencies only by the connections in the filter, so that the filter transmission function therefore has the desired smooth profile.

According to one preferred embodiment of the present invention, all of the bulk acoustic wave resonators in the bulk acoustic wave filter have effective resonator surfaces which differ in the surface shape and/or surface content. This allows spurious modes to be suppressed to an even greater extent.

According to one preferred embodiment of the present invention, at least two of the bulk acoustic wave resonators have an effective resonator surface with a different aspect ratio. The aspect ratio is the smallest dimension of the resonator within the surface plane divided by the largest dimension of the resonator within the surface plane. The directions of these two dimensions need not be perpendicular to each other. For a parallelogram, for instance, the aspect ratio would be the distance between the two opposing acute-angled corners divided by the distance between the two long opposing sides. The aspect ratio influences the position of the spurious modes in a similar manner to the way in which they are influenced by the surface content of the effective resonator surfaces of the bulk acoustic wave resonators, but does not change the impedance level. The spurious modes are thus effectively suppressed, while the useful resonance at the same time remains unchanged.

In one particularly preferred embodiment, all of the bulk acoustic wave resonators have effective resonator surfaces with different aspect ratios. This allows spurious modes to be suppressed to an even greater extent.

According to another likewise preferable embodiment of the present invention, at least two of the bulk acoustic wave resonators have effective resonator surfaces with a nonrectangular shape. A nonrectangular shape of the effective resonator surface of a bulk acoustic wave resonator means a shape in which the angles between the boundary lines of the effective resonator surface are not equal to 90°. This refinement of the resonators results in good spurious mode suppression.

In one particularly preferred embodiment, all the bulk acoustic wave resonators have effective resonator surfaces with a nonrectangular shape. This allows spurious modes to be suppressed to an even greater extent.

The best results can be achieved with bulk acoustic wave filters in which at least two of the bulk acoustic wave resonators have effective resonator surfaces with a different surface content, and a different aspect ratio at the same time. Appropriate choice of the surface content of the effective resonator surface and simultaneous variation of the aspect ratio of the effective resonator surface make it possible not only to satisfy impedance matching conditions but also to optimally suppress spurious modes.

A further improvement is achieved by embodiments in which all the bulk acoustic wave resonators have effective resonator surfaces with different surface contents and different aspect ratios. This allows spurious modes to be suppressed to an even greater extent.

Bulk acoustic wave filters are likewise preferable in which at least two of the bulk acoustic wave resonators have an effective resonator surface with a different aspect ratio and a nonrectangular shape at the same time.

Embodiments are particularly preferable in which all the bulk acoustic wave resonators have effective resonator surfaces with different aspect ratios and a nonrectangular shape. This allows spurious modes to be suppressed to an even greater extent.

Embodiments of the present invention are particularly preferable in which at least two bulk acoustic wave resonators of a bulk acoustic wave filter have an effective resonator surface with a different surface content, a different aspect ratio and a nonrectangular shape.

Embodiments in which all the bulk acoustic wave resonators have effective resonator surfaces with different surface contents, different aspect ratios and a nonrectangular shape are likewise particularly preferable. This allows spurious modes to be suppressed to an even greater extent.

Particularly good spurious mode suppression is achieved if the aspect ratio of the effective resonator surfaces of the bulk acoustic wave resonators according to the invention is between 1:1 and 1:5, in particular between 1:1.5 and 1:3.

If the effective resonator surfaces of the bulk acoustic wave resonators have a different surface content, then it is preferable for the surface contents of the effective resonator surfaces to differ from one another by at least 5%, in particular by at least 10%. It is very particularly preferable for the surface contents of the effective resonator surfaces to differ from one another by at least 20%, in particular by at least 50%.

The bulk acoustic wave filters are produced by interconnecting bulk acoustic wave resonators. The principle of varying the surface content of the effective resonator surface, the aspect ratio of the effective resonator surface and/or the angle between the boundary lines of the effective resonator surfaces in order to suppress spurious modes in the filter response can be applied to any filter topology. According to particularly preferred embodiments of the present invention, they are connected in the form of a one and a half-stage conductor filter, in the form of a two-stage conductor filter, in the form of a two and a half-stage conductor filter, in the form of a three-stage conductor filter or in the form of a three and a half-stage conductor filter, with three, four, five, six or seven bulk acoustic wave resonators being interconnected.

It is likewise preferable for the bulk acoustic wave resonators to be connected to form a bulk acoustic wave filter in the form of a one-stage balanced filter, in the form of a two-stage balanced filter or in the form of a three-stage balanced filter. In this case, four, eight or twelve bulk acoustic wave resonators are interconnected.

Other features which are considered as characteristic for the invention are set forth in the appended claims.

Although the invention is illustrated and described herein as embodied in a bulk acoustic wave filter, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a cross sectional view of a prior art bulk acoustic wave resonator;

FIG. 2 is a cross sectional view of a prior art stacked crystal filter;

FIG. 3 is a plan view showing two electrodes that are mounted one on top of the other and showing their effective resonator surface;

FIG. 7 is a graph of the scatter parameter from the input to the output ($S_{12}$), plotted against the frequency, for a prior art three-stage conductor filter with six identical square individual resonators;

FIG. 8 is a graph of the scatter parameter from the input to the output ($S_{12}$), plotted against the frequency, for an inventive three-stage conductor filter with six individual resonators whose effective resonator surfaces have different aspect ratios.

FIGS. 9–14 show embodiments of a one-stage, a one and a half-stage, a two-stage, a two and a half-stage, a three-stage, and a three and a half-stage filter, respectively.

DESCRIPTION OF THE PREFERRED EMBODIMENTS

Figure 4:
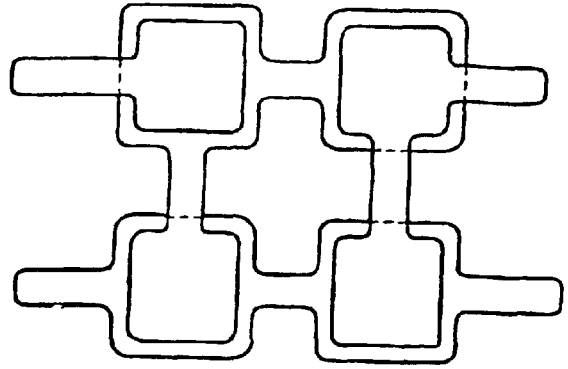
FIG. 4 is a plan view of a prior art two-stage conductor filter.

Referring now to the figures of the drawing in detail and first, particularly, to FIG. 4 thereof, there is shown a prior art two-stage conductor filter with four square bulk acoustic wave resonators of the same size. The four square bulk acoustic wave resonators each have an identical effective resonator surface. The spurious modes of each individual resonator occur at the same frequency points, and can be found in a corresponding manner in the electrical response of the filter.

Figure 5:
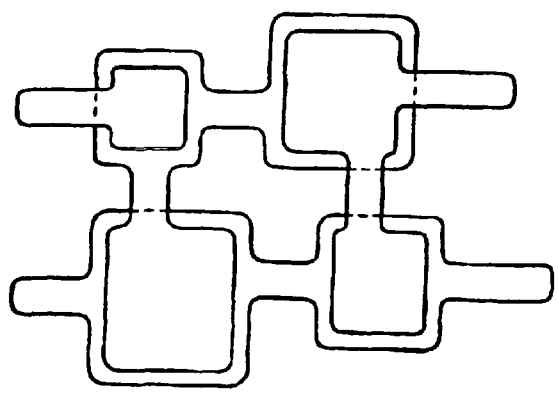
FIG. 5 is a plan view of an inventive two-stage conductor filter formed from bulk acoustic wave resonators with the effective resonator surfaces having different surface contents.

FIG. 5 shows a two-stage conductor filter with four bulk acoustic wave resonators, with effective resonator surfaces which have different surface contents. Each resonator has different spurious mode frequencies. The connections in the filter result in an averaging effect, so that the individual spurious modes in the filter response cannot be noticed so strongly in comparison to the prior art embodiment shown in FIG. 4.

Figure 6:
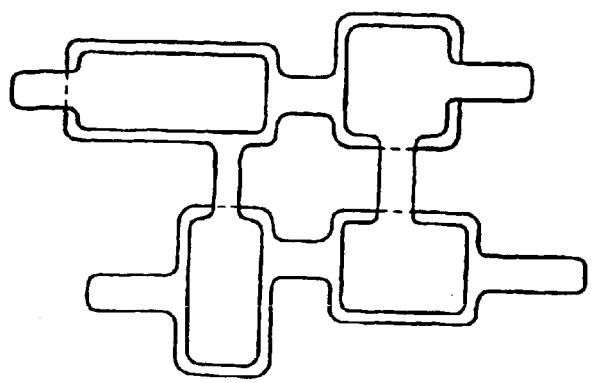
FIG. 6 is a plan view of an inventive two-stage conductor filter formed from bulk acoustic wave resonators whose effective resonator surfaces have different aspect ratios.
Figure 9:
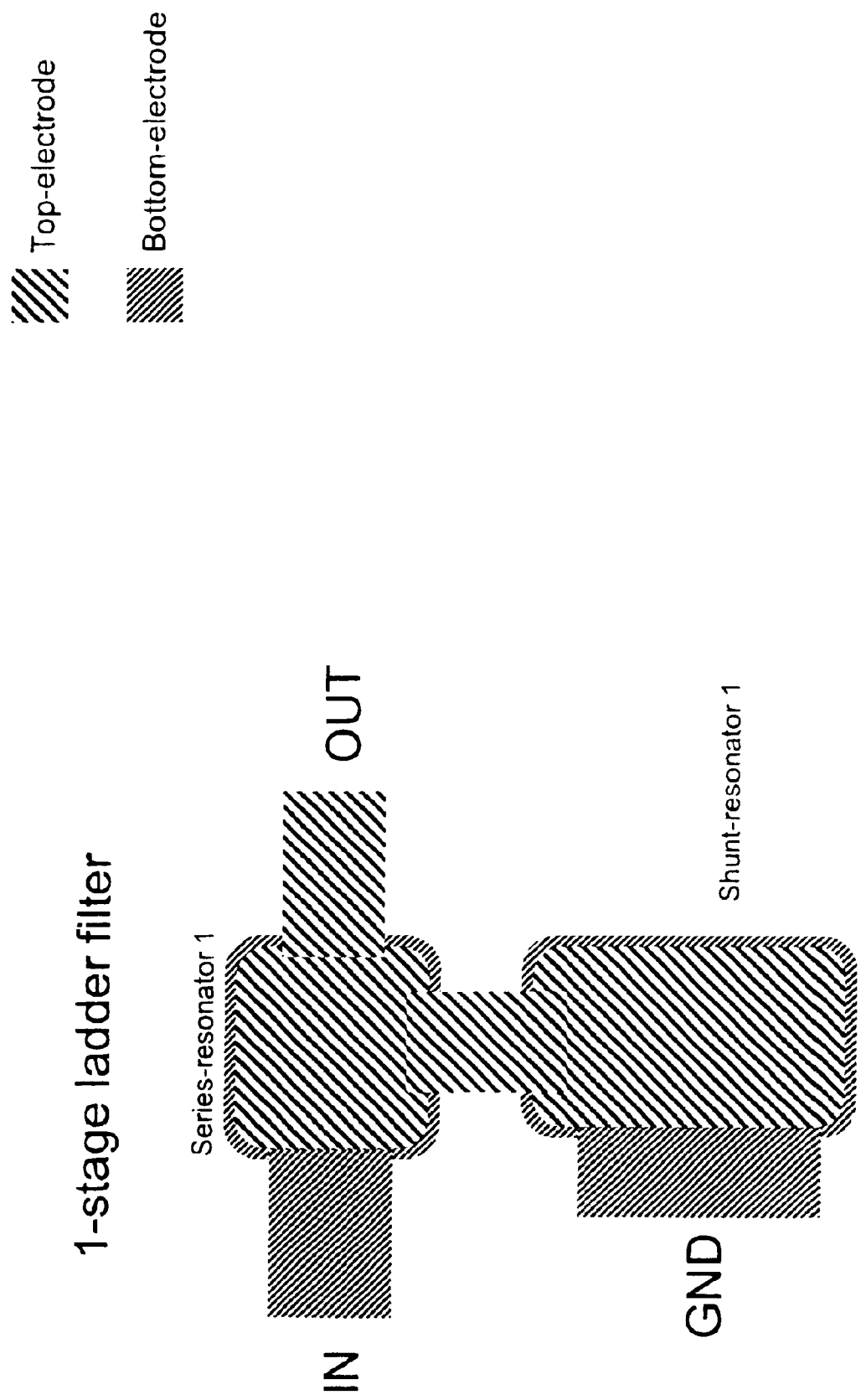
FIGS. 9–14 show a one-stage, a one and a half-stage, a two-stage, a two and a half-stage, a three-stage, and a three and a half-stage filter, respectively.
Figure 10:
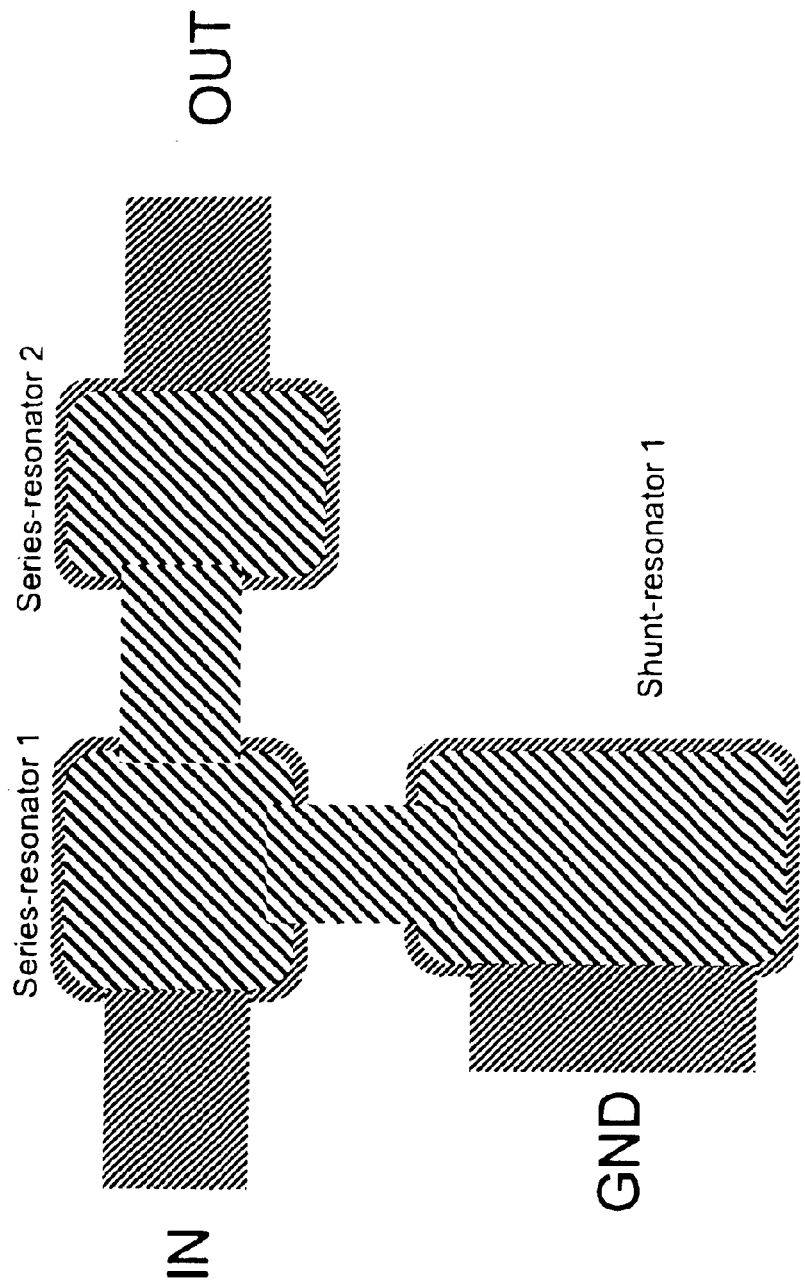
Figure 11:
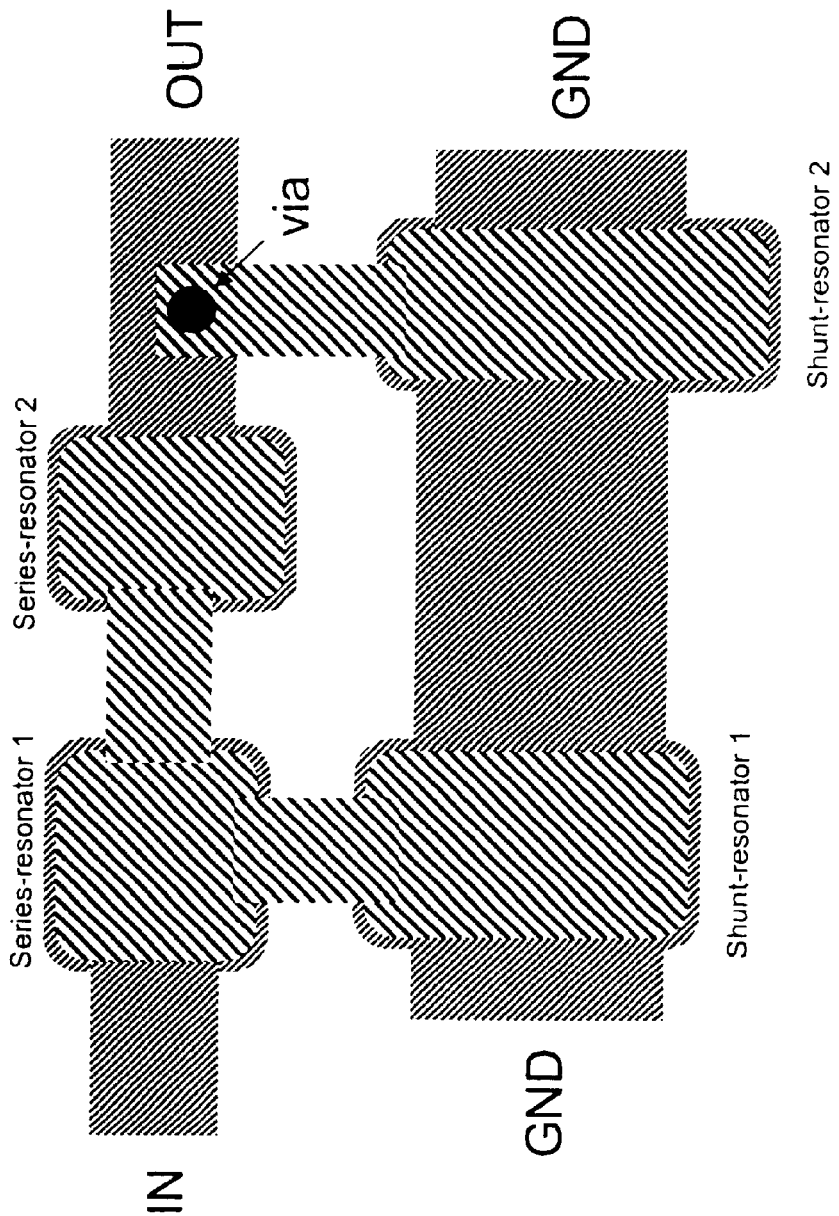
Figure 12:
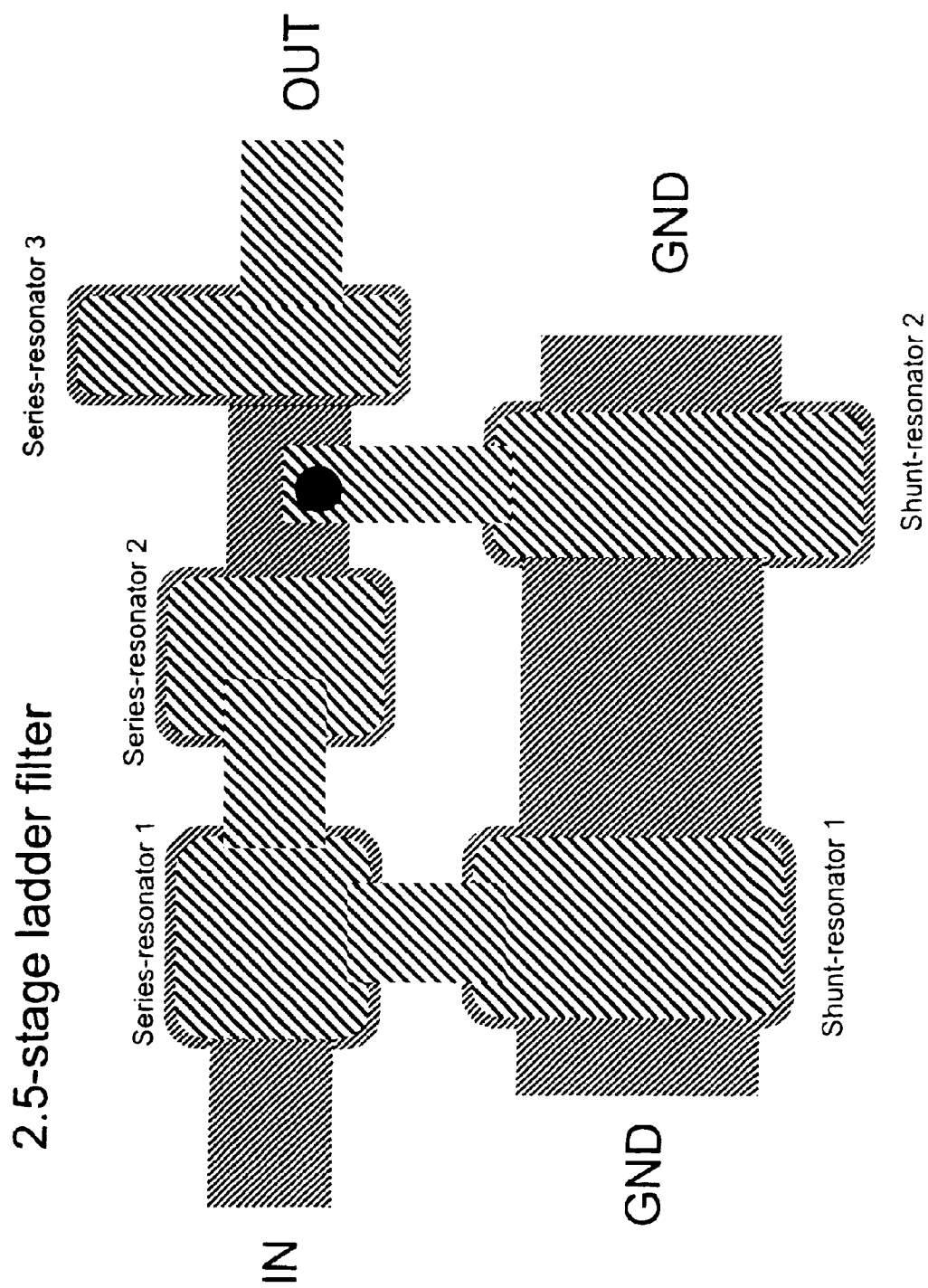
Figure 13:
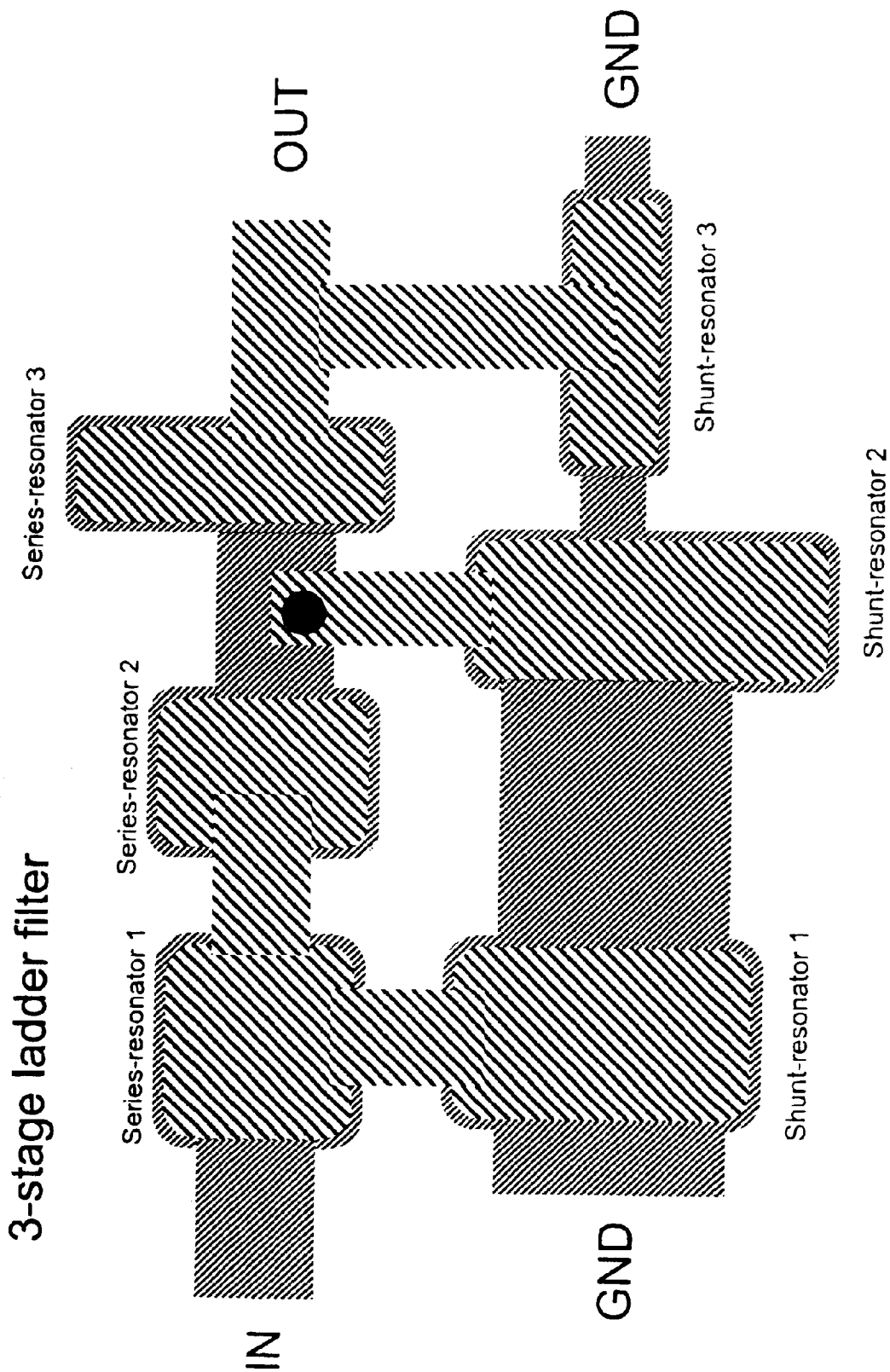
Figure 14:
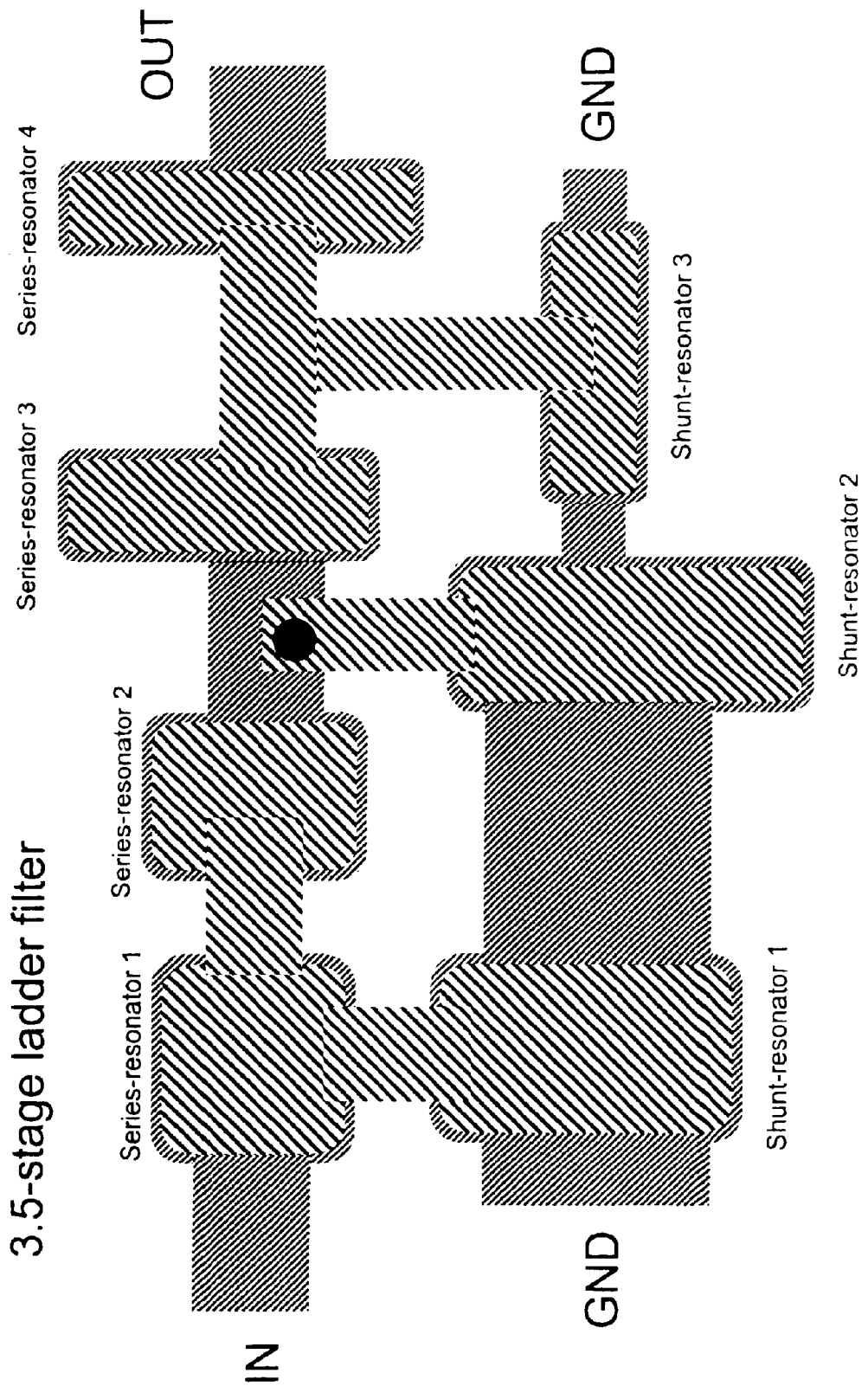

FIG. 6 shows a two-stage conductor filter with four bulk acoustic wave resonators with effective resonator surfaces which have different aspect ratios, although their surface contents are the same. The aspect ratio influences the position of the spurious modes in a similar way to that in the embodiment shown in FIG. 5, although the impedance level of the filter remains unchanged at the same time.

FIGS. 7 and 8 each show a schematic graph of the scatter parameter from the input to the output $S_{12}$, on a logarithmic scale, plotted against the frequency for a three-stage conductor filter with six individual resonators. The scatter matrix of the conductor filter was determined in a known manner using a frequency analyzer, in order to determine $S_{12}$.

FIG. 7 shows the characteristic of a prior art conductive filter and includes six identical square individual resonators with identical effective resonator surfaces. The characteristic shows "noise" in the pass band, which is caused by spurious modes of the individual resonators.

FIG. 8 shows the characteristic of a conductor filter according to the present invention, which has the same topology as the conductor filter whose characteristic is shown in FIG. 7, although the effective resonator surfaces of the six individual resonators have different aspect ratios. The noise in the pass band is averaged out from the curve, since the spurious modes of the individual resonators occur at different frequency points.

Similar results are obtained from a comparison on the one hand of filters with individual resonators with square effective resonator surfaces, and on the other hand of filters in which the effective resonator surfaces of the individual resonators have a nonrectangular shape (the angles between the boundary lines of the effective resonator surfaces of the individual resonators are not equal to 90°). In this case, considerably less noise is found in the pass band for the filter whose individual resonators have effective resonator surfaces with a nonrectangular shape.

We claim:

1. A bulk acoustic wave filter, comprising:
   a plurality of bulk acoustic wave resonators;
   each of said plurality of bulk acoustic wave resonators having at least one first electrode, one piezoelectric layer and one second electrode; and
   said plurality of bulk acoustic wave resonators having effective resonator surfaces with different surface shapes and/or different surface contents;
   the effective resonator surfaces of all of said plurality of bulk acoustic wave resonators having different aspect ratios;
   the aspect ratios of the effective resonator surfaces being between 1:1 and 1:5.

2. The bulk acoustic wave filter according to claim 1, wherein the effective resonator surfaces of all of said plurality of bulk acoustic wave resonators have different surface shapes and/or different surface contents.

3. The bulk acoustic wave filter according to claim 1, wherein the effective resonator surfaces of at least two of said plurality of bulk acoustic wave resonators have a nonrectangular shape.

4. The bulk acoustic wave filter according to claim 1, wherein the effective resonator surfaces of all of said plurality of bulk acoustic wave resonators have a nonrectangular shape.

5. The bulk acoustic wave filter according to claim 1, wherein the effective resonator surfaces have surface contents that differ from one another by at least 5%.

6. The bulk acoustic wave filter according to claim 1, wherein the effective resonator surfaces have surface contents that differ from one another by at least 10%.

7. The bulk acoustic wave filter according to claim 1, wherein the effective resonator surfaces have surface contents that differ from one another by at least 20%.

8. The bulk acoustic wave filter according to claim 1, wherein the effective resonator surfaces have surface contents that differ from one another by at least 50%.

9. The bulk acoustic wave filter according to claim 1, wherein said plurality of bulk acoustic wave resonators are connected in a form selected from a group consisting of a one and a half-stage conductor filter, a two-stage conductor filter, a two and a half-stage conductor filter, a three-stage conductor filter, and a three and a half-stage conductor filter.

10. The bulk acoustic wave filter according to claim 1, wherein said plurality of bulk acoustic wave resonators are connected in a form selected from a group consisting of a one-stage balanced filter, a two-stage balanced filter, and a three-stage balanced filter.

11. The bulk acoustic wave filter according to claim 1, wherein said plurality of bulk acoustic wave resonators include exactly two bulk acoustic wave resonators.

12. A bulk acoustic wave filter, comprising:

a plurality of bulk acoustic wave resonators;

each of said plurality of bulk acoustic wave resonators having at least one first electrode, one piezo-electric layer and one second electrode; and said plurality of bulk acoustic wave resonators having effective resonator surfaces with different surface shapes and/or different surface contents;

the effective resonator surfaces of all of said plurality of bulk acoustic wave resonators having different aspect ratios;

the aspect ratios of the effective resonator surfaces being between 1:1.5 and 1:3.

* * * * *

(12) INTER PARTES REEXAMINATION CERTIFICATE (799th)
United States Patent
Aigner et al.

(10) Number: US 6,909,340 C1
(45) Certificate Issued: Jan. 15, 2014

(54) BULK ACOUSTIC WAVE FILTER UTILIZING RESONATORS WITH DIFFERENT ASPECT RATIOS

(75) Inventors: Robert Aigner, München (DE); Stephan Marksteiner, Putzbrunn (DE); Winfried Nessler, München (DE); Lüder Elbrecht, München (DE)

(73) Assignee: Avago Technologies Wireless IP (Singapore) Pte. Ltd., Singapore (SG)

Reexamination Request:
No. 95/001,595, Apr. 4, 2011

Reexamination Certificate for:
Patent No.: 6,909,340
Issued: Jun. 21, 2005
Appl. No.: 10/446,984
Filed: May 27, 2003

Related U.S. Application Data

(63) Continuation of application No. PCT/EP01/12825, filed on Nov. 6, 2001.

(30) Foreign Application Priority Data

Nov. 24, 2000 (DE) .................................. 100 58 339

(51) Int. Cl.
*H03H 9/00* (2006.01)
*H03H 9/58* (2006.01)

(52) U.S. Cl.
USPC ........... 333/189; 333/191; 310/312; 310/322; 310/363

(58) Field of Classification Search
None
See application file for complete search history.

(56) References Cited

To view the complete listing of prior art documents cited during the proceeding for Reexamination Control Number 95/001,595, please refer to the USPTO's public Patent Application Information Retrieval (PAIR) system under the Display References tab.

*Primary Examiner* — Anjan K. Deb

(57) ABSTRACT

The invention relates to bulk acoustic wave filters including at least two bulk acoustic wave resonators. Each of these resonators includes at least one first electrode, a piezoelectric layer, and a second electrode. At least two of the bulk acoustic wave resonators have effective resonator surfaces which differ in their surface form and/or surface content. The inventive design of the bulk acoustic wave resonators enables optimal suppression of interference modes without influencing the impedance level of the filter.

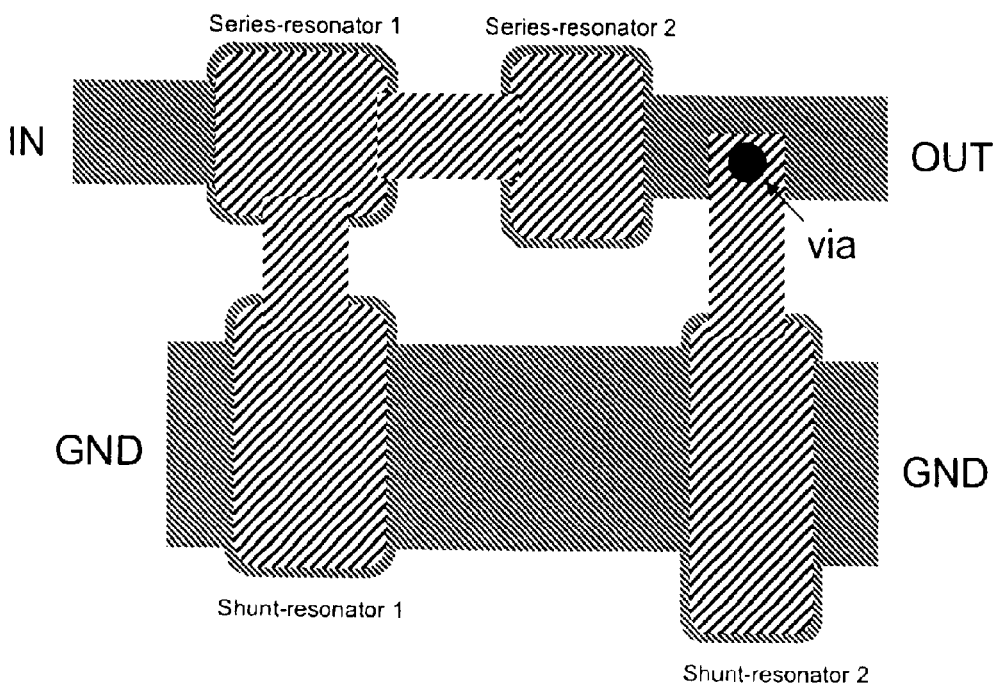

INTER PARTES REEXAMINATION CERTIFICATE ISSUED UNDER 35 U.S.C. 316

THE PATENT IS HEREBY AMENDED AS INDICATED BELOW.

AS A RESULT OF REEXAMINATION, IT HAS BEEN DETERMINED THAT:

Claims 1-12 are cancelled.

* * * * *